United States Patent [19]

Dalal

[11] 4,251,287
[45] Feb. 17, 1981

[54] AMORPHOUS SEMICONDUCTOR SOLAR CELL

[75] Inventor: Vikram L. Dalal, Newark, Del.

[73] Assignee: The University of Delaware, Newark, Del.

[21] Appl. No.: 80,194

[22] Filed: Oct. 1, 1979

[51] Int. Cl.³ .............................................. H01L 31/04
[52] U.S. Cl. ................................. 136/258; 148/178; 357/2; 357/30
[58] Field of Search .................. 148/178; 357/2, 30; 136/89 GA, 89 SG, 89 SJ, 89 TF; 29/572

[56] References Cited

U.S. PATENT DOCUMENTS

| 3,089,794 | 5/1963 | Marinace | 148/1.5 |
| 4,064,521 | 12/1977 | Carlson | 357/2 |
| 4,142,195 | 2/1979 | Carlson et al. | 357/15 |

Primary Examiner—Aaron Weisstuch
Attorney, Agent, or Firm—Connolly and Hutz

[57] ABSTRACT

A solar cell comprising a back electrical contact, amorphous silicon semiconductor base and junction layers and a top electrical contact includes in its manufacture the step of heat treating the physical junction between the base layer and junction layer to diffuse the dopant species at the physical junction into the base layer.

26 Claims, 3 Drawing Figures

AMORPHOUS SEMICONDUCTOR SOLAR CELL

BACKGROUND OF INVENTION

In view of the serious energy problems, solar energy represents one form of energy which has received a great deal of attention. Various approaches have been taken by those in the art to tap this source of energy. Such approaches have included the fabrication of solar cells. In general, solar cells include semiconductors disposed intermediate a pair of electrical contacts. One such form which has been considered is the utilization of amorphous silicon as the semiconductor material.

Amorphous silicon has many properties which would make it a desirable material for photovoltaic devices. For example, it has a bandgap (1.5-2.0 eV) which lies in the range needed for high efficiency. Additionally, amorphous silicon is easy to deposit. Further it has absorption coefficient. Hence, a thin film can absorb most of the light. Moreover, its electronic properties can be changed by doping with n and p type dopants. Despite these attractive properties, present day amorphous silicon devices have not achieved high efficiencies. Photovoltaic conversion efficiency, for example, has been limited to an about 6% range.

To date, the highest efficiencies with such amorphous silicon solar cells has been obtained by using Metal-Insulator-Semiconductors (MIS) or Schottky diodes. However, both MIS and Schottky diodes suffer from various disadvantages. In this respect, the necessity of using a metal layer reduces light transmission into the semiconductor. Additionally, control of interface state densities is particularly difficult, and hence the cells tend to have non-reproducible or low outputs.

As an alternative to MIS and Schottky diodes, homojunction solar cells using amorphous silicon has also been studied. However, the results were poor, partly because of excessive recombination at the interface between p and n (with i) regions of the junction.

SUMMARY OF INVENTION

An object of this invention is to provide an improved amorphous semiconductor solar cell.

A further object of this invention is to provide a method for manufacturing such solar cells wherein there is a reduction of interface combination which thereby would result in increased current and voltage and, thus, also increased efficiency.

In accordance with this invention, a solar cell incorporating an amorphous silicon semiconductor includes in its manufacture the step of heat treating the physical junction of the base and junction layers to diffuse the dopant species at the physical junction into the amorphous silicon base layer.

In a preferred embodiment of this invention, the heat treating includes utilizing a dopant species having a higher diffusion coefficient than B or P, and the heat treating is at a temperature less than the temperature at which the amorphous silicon:H bonds would be broken.

In an alternative practice of this invention, the heat treating may be an annealing step to drive the electrical junction into the base layer below the physical junction. Preferably such annealing takes place in an ambient of F and H.

THE DRAWINGS

DETAILED DESCRIPTION

As previously indicated, amorphous silicon solar cells, including both the homojunction type and the heterojunction type, have been studied heretofore. Accordingly, a detailed description thereof including its method of manufacture is not necessary, and the following description will refer to known practices only to the extent it is necessary for an understanding of this invention. At the onset, it is noted that the term "amorphous silicon" is meant to include not only a-Si, but also, for example, a-Si$_{1-x}$Ge$_x$, a-Si$_x$Ge$_{1-x}$, a-Si$_x$O$_{1-x}$ and a-Si$_y$Ge$_z$O$_{(1-y-z)}$ alloys. Generally such a cell 10 would be formed by utilizing an electrically conducting substrate 12 as a back or opaque contact and growing an amorphous silicon base layer 14 thereon.

Typically a-Si is grown on the substrate by plasma deposition from SiH$_4$ or SiF$_4$ or mixtures of these or by chemical vapor deposition from SiH$_4$ or by sputtering from a-Si target in an atmosphere containing H as one of the constituents. N-type dopant species such as As, P or B are introduced as gases (AsH$_3$, PH$_3$, B$_2$H$_6$, AsCl$_3$, etc.). P-type dopants such as Ga, Al, etc are then introduced either by bubbling H$_2$ through metallorganic compounds of Ga or Al, or by melting Ga or GaCl$_3$, etc. and passing H$_2$ or HCl through molten metal. The dopant is changed from one species to another by shutting off the dopant valve from one dopant source and opening another valve from another dopant source which admits the second kind of dopant. Thus, for example, if the base layer is an n-type, it is grown by using AsH$_3$ or PH$_3$ in the desired concentrations in the gas (e.g. SiH$_4$) from which the Si is deposited, and then the p+ layer is grown by shutting off the AsH$_3$ valve and opening a valve which lets the B$_2$H$_6$ or the (H$_2$+Ga) into the deposition chamber.

Figure 1:
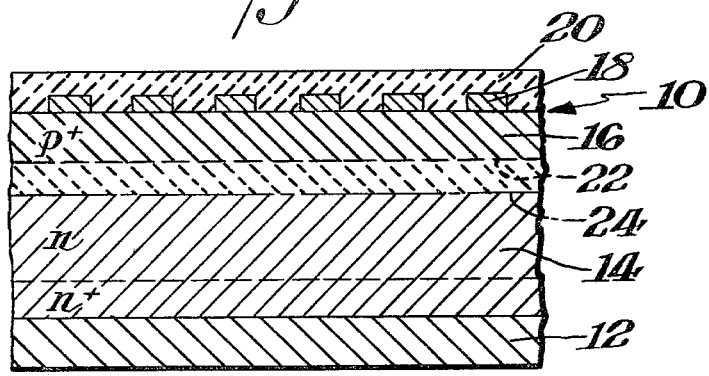
FIG. 1 illustrates a homojunction solar cell having amorphous silicon semiconductor material in accordance with this invention.

Substrate 12 may be any suitable material including a metal sheet or film or a conducting glass film. In the illustrated cell 10 of FIG. 1, substrate 12 makes ohmic contact to heavily doped n+ type region of base layer 14. Next, the n-type region of base layer 14 is grown and the dopant is changed from n to p type and a p+ layer or junction layer 16 is then grown with physical junction 22 therebetween. A second or transparent electrical contact, such as metal grid 18, is then formed with a conventional encapsulant 20 to complete the cell components. In the cell of FIG. 1 preferred thicknesses are, for example, 0.03-1 μm for the a-Si n+ layer, 0.1-1 μm for the n layer and 0.01-1 μm for the p+ layer.

Figure 2:
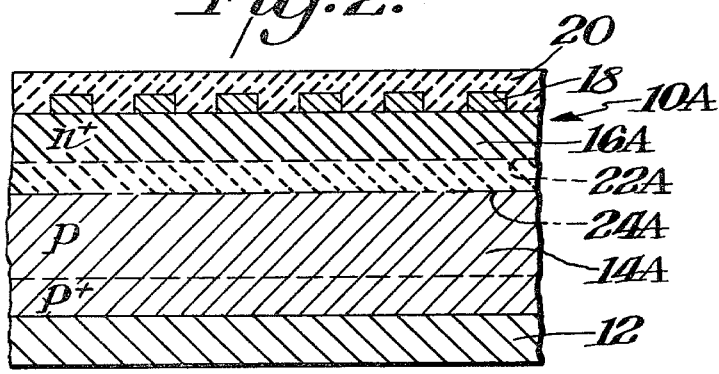
FIG. 2 shows an alternative homojunction solar cell in accordance with this invention.
Figure 3:
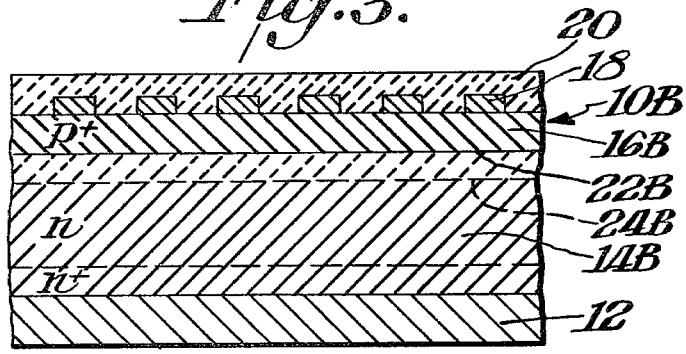
FIG. 3 shows a heterojunction solar cell in accordance with this invention.

In the homojunction cell 10 of FIG. 1, the single amorphous silicon member comprising layers 14, 16 provides a homojunction between electrical contacts 12 and 18. Obviously, other conventional forms of solar cells may likewise be used. FIG. 2, for example, illustrates an alternative arrangement wherein homojunction cell 10A includes amorphous silicon layers 14A, 16A resulting in an n+ p p+ cell. FIG. 3, on the other hand, shows the practice of this invention with heterojunction solar cell 10B wherein base layer 14B contains an n+ region adjacent substrate 12 and an overlying n or i (intrinsic) region. Next, another layer 16B is provided with p+ conduction, thereby forming a physical junction 22B with layer 14B. Layer 14B may be a-Si and layer 16B may be a-Si$_{1-x}$O$_x$ to provide the heterojunction. The invention may also be practiced with solar cells having a stack of a-Si based junctions such as described in *Appl. Phys. Lett.* 35(2), July 15 1979, pages 187-89, the details of which are incorporated herein by reference thereto.

Typically in as grown junctions such as the p+ n type of FIG. 1, there is an excess reverse saturation current which would arise from the presence of excess recombination centers at the physical junction 22 (or interface) between p+ and n (or n+ and p of FIG. 2) regions. These excess recombination centers arise because of growth interruptions while the dopant species is being changed.

The present invention is based upon the recognition that the excess reverse saturation current can be reduced by reducing the influence of these excess centers. In accordance with one practice of the invention, this is accomplished by annealing the physical junction in an ambient of F and/or H at high temperatures (but below the crystallization temperature of a-Si:F) such as about 550°-600° C. for a time long enough (such as about 30-120 minutes) to allow diffusion of dopant from the heavily doped layer 16 across the physical junction 22 and into the base region.

The aforementioned anneal/diffusion process may be accomplished in the deposition chamber in which the a-Si was deposited or in a separate chamber in which an H and/or F plasma exists. The annealing is done immediately after depositing the junction layer.

By this heat treatment, the dopant species from the junction region is moved from the previous interfacial region, and an electrical junction 24 is thereby formed below the physical junction 22 which inherently would thereby disappear since the dopant species which created the physical junction 22 has been diffused, thus leaving electrical junction 24 as the new junction. Accordingly the original interfacial recombination is no longer important because the original states now lie in the heavily doped junction region in which the lifetime is not controlled by the original interfacial states, but rather by radiative or Auger recombination. The new interfacial region between the junction 24 and the base layer 14 is free of any imperfection states introduced during the original growth process. Accordingly, interfacial recombination is no longer a problem with such post-annealed junctions.

An H or F ambient is selected to prevent the disassociation of H or F from a-Si:F or a-Si:H or a-Si$_{1-x}$Ge$_x$:F/H. If necessary, a post-diffusion anneal in H plasma may also be done at a lower temperature, as later described.

As an example of the invention described above, a typical a-Si junction may consist of 500 Å of P doped n+a-Si deposited on 5000 Å of lightly B doped p a-Si. By annealing the junction at, for example, 550°-600° C. for about two hours, the junction 24 (or 24A or 24B) is moved downwardly from physical junction 22 (or 22A or 22B) by 30-50 Å. This will effectively remove most of the growth-generated interface states from playing a major part in recombination and hence increase J$_{sc}$, V$_{oc}$ and efficiency. Such a junction may later be annealed in an H plasma at a lower temperature (about 350°-400° C.) from about 30-120 min. to recreate the Si:H bonds which may have been broken by high temperature annealing at 600° C.

While the above practice of the invention, which utilizes annealing as the heat treatment, has certain advantages, a preferred practice of the invention is to use a lower temperature heat treatment. In this preferred practice of the invention, the junction characteristics are improved by using a dopant species which has a higher diffusion coefficient than B or P. For a p+ junction layer, i.e. to make a p+n junction and diffuse p+ impurity into n base, it is preferable to use Ga or Al, and heat-treat the junction at about 300°-400° C. for 30-120 minutes, or more preferably 350°-400° C. for 30-60 minutes. This low-temperature treatment does not break a-Si:H bonds and hence is preferred over the high temperature anneal described above. Such low temperature annealing may be done in the deposition furnace immediately after the formation of, for example, the p+ layer. It may also be desirable to keep the H plasma in the deposition chamber during this anneal so as to assure that the a-Si:H bonds are not broken.

It is to be understood that while the invention has been particularly described with respect to amorphous silicon, other amorphous semiconductors such as germanium and its alloys may be used in the practice of the invention.

At various portions of this specification, abbreviations from the Periodic Table have been used to refer to various elements.

What is claimed is:

1. In a method for manufacturing a solar cell wherein a substrate is provided as an ohmic contact and an amorphous semiconductor base layer of n-type conductivity is grown on the substrate and an amorphous semiconductor junction layer of p-type conductivity is deposited on the base layer to form a physical junction therebetween and a further electrical contact is formed on the junction layer, the improvement being incorporating a rapidly diffusing dopant species in said p type junction layer heat treating the physical junction of the base layer and the junction layer to diffuse the dopant species at the physical junction into the base layer to thereby create an electrical junction below the former physical junction.

2. In the method of claim 1 wherein the amorphous semiconductor is amorphous silicon containing hydrogen, the p-type junction layer including a dopant species having a higher diffusion coefficient than B, and the heat treating being a diffusion of dopant species at a temperature lower than the temperature at which hydrogen is evolved from the amorphous silicon:H semiconductor.

3. In the method of claim 2 wherein the heat treating is at a temperature of 300°-400° C. for 30 to 120 minutes.

4. In the method of claim 3 wherein the dopant is Ga.

5. In the method of claim 3 wherein the dopant is Al.

6. In the method of claim 1 wherein the diffusion heat treatment is followed by a lower temperature treatment in a plasma of H.

7. In the method of claim 7 wherein the lower temperature treatment is at about 350°-400° C. for 30-120 minutes.

8. In the method of claim 1 wherein the diffusion heat treatment is at a temperature of about 550°-600° C. for 30 to 120 minutes.

9. In the method of claim 1 wherein the amorphous semiconductor is silicon or an alloy thereof.

10. In the method of claim 1 wherein the solar cell comprises a homojunction.

11. In the method of claim 1 wherein the solar cell comprises a heterojunction.

12. In the method of claim 1 wherein the solar cell includes a stack of amorphous silicon base junctions in sequential array.

13. In the method of claim 1 wherein the amorphous semiconductor is germanium or an alloy thereof.

14. A solar cell made by the method of claim 1.

15. In a method for manufacturing a solar cell wherein a substrate is provided as an ohmic contact and an amorphous semiconductor base layer of p-type conductivity is grown on the substrate and an amorphous semiconductor junction layer of n-type conductivity is deposited on the base layer to form a physical junction therebetween and a further electrical contact is formed on the junction layer, the improvement being incorporating a rapidly diffusing dopant species in said n type junction layer and heat treating the physical junction of the base layer and junction layer to diffuse the dopant species at the physical junction into the base layer to thereby create an electrical junction below the former physical junction.

16. In the method of claim 15 wherein the amorphous semiconductor is amorphous silicon containing hydrogen, the n-type junction layer including a dopant species having a higher diffusion coefficient than P, and the heat treating being a diffusion of dopant species at a temperature lower than the temperature at which hydrogen is evolved from the amorphous silicon:H semiconductor.

17. In the method of claim 16 wherein the heat treating is at a temperature of 300°–400° C. for 30 to 120 minutes.

18. In the method of claim 15 wherein the diffusion heat treatment is followed by a lower temperature treatment in a plasma of H.

19. In the method of claim 18 wherein the lower temperature treatment is at about 350°–400° C. for 30 to 120 minutes.

20. In the method of claim 15 wherein the diffusion heat treatment is at a temperature of about 550°–600° C. for 30 to 120 minutes.

21. In the method of claim 15 wherein the amorphous semiconductor is silicon or an alloy thereof.

22. In the method of claim 15 wherein the solar cell comprises a homojunction.

23. In the method of claim 18 wherein the solar cell comprises a heterojunction.

24. In the method of claim 15 wherein the solar cell includes a stack of amorphous silicon based junctions in sequential array.

25. In the method of claim 15 wherein the amorphous semiconductor is germanium or an alloy thereof.

26. A solar cell made by the method of claim 15.

* * * * *

UNITED STATES PATENT OFFICE
CERTIFICATE OF CORRECTION

Patent No. 4,251,287             Dated February 17, 1981

Inventor(s)   Vikram L. Dalal

It is certified that error appears in the above-identified patent and that said Letters Patent are hereby corrected as shown below:

Column 1, after the title, the following paragraph should be inserted:

-- The Government has rights to this invention pursuant to Contract No. DE-AC-03-79-ET-23034 awarded by the U.S. Department of Energy. --

Signed and Sealed this

Eighteenth Day of August 1981

[SEAL]

Attest:

GERALD J. MOSSINGHOFF

Attesting Officer

Commissioner of Patents and Trademarks